United States Patent
Reyes et al.

(10) Patent No.: US 6,599,763 B1
(45) Date of Patent: Jul. 29, 2003

(54) WAFER RANDOMIZATION AND ALIGNMENT SYSTEM INTEGRATED INTO A MULTIPLE CHAMBER WAFER PROCESSING SYSTEM

(75) Inventors: Jose Carlos Reyes, Austin, TX (US); Michael McCarthy, Red Rock, TX (US); Toby Winters, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/597,291

(22) Filed: Jun. 20, 2000

(51) Int. Cl.[7] .............................................. H01L 21/66
(52) U.S. Cl. ...................... 438/14; 438/462; 438/17; 414/935; 414/936
(58) Field of Search ........................... 438/462, 14, 16; 414/935, 936, 939

(56) References Cited

U.S. PATENT DOCUMENTS 5,777,327 A * 7/1998 Mizuno ...................... 250/310
6,180,424 B1 * 1/2001 Tigelaar et al. ............... 438/14
6,336,086 B1 * 1/2002 Perez et al. .................... 703/13

\* cited by examiner

Primary Examiner—Caridad Everhart

(57) ABSTRACT

A reduction in wafer processing cycle time is achieved by conducting wafer verification and slot randomization of a set of wafers as the wafers are moved through a singular processing location. In an example embodiment, a method of processing a set of wafers in a wafer processing system includes providing each of the wafers with a scribe code thereon. Each of the wafers is presented to a first processing location with the processing location having at least one processing chamber. The scribe code on each wafer is then read as the wafer is being placed into the processing chamber. Each wafer is processed and the set of wafers is slot randomized as they are removed from the first processing location and placed into a wafer cassette. An important advantage of the present invention is the reduced cycle times and reduced capital investment that this method and system bring to wafer processing.

13 Claims, 5 Drawing Sheets

WAFER RANDOMIZATION AND ALIGNMENT SYSTEM INTEGRATED INTO A MULTIPLE CHAMBER WAFER PROCESSING SYSTEM

FIELD OF THE INVENTION

The present invention generally relates to wafer handling in a semiconductor processing plant and, more particularly, to reducing cycle time in wafer processing by eliminating interim wafer sorting operations as wafers move through a multiple chamber processing tool.

BACKGROUND OF THE INVENTION

Some manufacturing processes require that the item being processed be rotated regularly in order to ensure that the item is properly processed, such as when painting an object or when applying a coating to a substrate. In the case of a mechanical process, the object is rotated to ensure that the tooling is being worn evenly or that the tooling is mechanically treating the object evenly. Even though some of these items may be individually processed, or processed in small lots, the items may form part of a larger lot being manufactured and it is difficult to distinguish the progress of the individual item as it moves through the processing line. As the number of processing steps increase tracking becomes even more difficult. This is particularly a problem in the processing of wafers in a semiconductor processing plant.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in groups of about 25 wafers. The wafers are then disposed within a carrier and move from one process to another in the carrier. The carriers are usually tracked by their carrier code by a computer system as they move through the plant.

Once a lot has been retrieved, and the equipment has been set up, the operation on the wafers by a particular piece of equipment, or "tool," can begin. At this point, the lot is "moved-in" to the operation. An operator on the line then communicates this information to the host computer. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer has to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and control system (e.g., the distributed computer system). An empty carrier management system as well as a separate test wafer management system may also form part of the AMHS.

Data gathered during the course of wafer processing is used to diagnose yield problems and forms the basis of yield improvement efforts. Such data includes parametric electrical test data gathered on individual circuits and test structures fabricated on the wafers, as well as wafer sort data which tests the suitability for use of the wafers once wafer processing is completed. One of the possible sources of yield variation is the order in which wafers in a lot are processed at a given processing step. When the processing is done one wafer at a time per step, a variation in yield may be caused by a build up of contaminants, uneven heating of a processing chamber or another physical aspect that changes during the processing of the lot. In a batch operation, the physical location of the wafer in the batch processing equipment may influence uniformity of the processing effects across the lot. In an example where wafers are moving through a contaminated chamber, if the order in which each wafer is processed is known then the final wafer yield may be plotted against the processing order in this step. For each wafer in a lot a drop-off in yield versus processing order would be observed due to the contamination problem. This data is used to make adjustments to the line to improve yield; however, this wafer tracking method lacks the level of precision in the data collected required by chip plants today.

In tracking the wafer processing order, wafer sorters have been used to read scribed wafer identifiers, either immediately prior to or after critical processing steps. Sorters typically read the scribe marks to ensure that the wafers and the cassette are properly matched together as the wafers move through the semiconductor processing line. The scribe marks on the wafers usually comprise a series of characters formed in the wafer substrate that serve as an identifier. Since integrated circuits should not be formed on the scribe marks, the scribe marks are typically positioned near the unused outer edge of the wafer to maximize usable wafer surface area.

Randomizing the order of the wafers prior to such steps is often done to ensure certain processing effects are not compounded. The wafer positional data is fed into a computer system, the device performance metrics for a wafer lot of interest are manually entered, and then all possible graphs of the device metrics for that lot versus wafer processing order at each step are generated. The data is then reviewed to determine those steps at which the processing order may affect performance. This type of approach to tracking wafers can be costly in its implementation due to the amount of hardware and software needed to both randomize the wafer order and interface with the wafer processing system's main computer database.

SUMMARY OF THE INVENTION

The present invention is directed to addressing the above and other needs in connection with reducing wafer processing cycle times as the wafers move through a multiple chamber processing tool. According to one aspect of the invention, it has been discovered that wafer sorting operations proximate to a processing location having a multiple chamber processing tool (or cluster tool) can be eliminated by conducting wafer verification and cassette slot randomization of a set of wafers while at the processing location.

According to one aspect of the invention, a method of processing a set of wafers in a wafer processing system includes providing each of the wafers with a scribe code thereon. Each of the wafers is then presented to a first processing location, the processing location having at least one processing chamber. The scribe code on each wafer is read as the wafer is being placed into the at least one processing chamber. Each of the wafers in the at least one processing chamber is processed and the set of wafers is randomized as they are removed from the first processing location and placed into a wafer cassette.

According to another aspect of the invention, a system for processing wafers in a wafer processing system includes a set of wafers having a scribe code thereon and an arrangement for presenting each of the wafers to a first processing location, the first processing location having at least one processing chamber. An arrangement for reading the scribe code on each wafer as the wafer is being placed into the at least one processing chamber is also included. An arrangement for randomizing the set of wafers as they are removed from the first processing location and placed into a wafer cassette is included.

In yet another aspect of the invention, an apparatus for processing a set of wafers in a wafer processing system includes an entry port for receiving a set of wafers having a scribe code thereon and at least one processing chamber for processing each of the wafers. An automated scribe code reading arrangement adapted to read the scribe code on each wafer as the wafer is being placed into the at least one processing chamber is included. The apparatus also includes a wafer handling arrangement adapted to place the wafers into the processing chamber and randomize the set of wafers as they are removed from the processing chamber and placed into a wafer cassette. In a related embodiment, an alarm and a manual scribe reading device are included where the automated scribe code reader is unable to read the scribe codes on the incoming wafers.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for verifying and cassette slot randomizing a set of wafers in a wafer processing system. The invention is particularly suited for wafer processing lines that utilize a large quantity of wafer sorters or have a large quantity of wafer sorting operations incorporated therein. While the present invention is not necessarily limited to a wafer processing application the invention will be better appreciated using a discussion of exemplary embodiments in such a specific context.

In an example embodiment, a system for processing a set of wafers in a multiple chamber processing tool includes equipping the tool with scanning equipment that reads the scribe code as the wafer is being placed by a robotic arm into one of the processing chambers. After processing is completed at a particular processing location (for example, etching) the wafer is removed from the chamber and is returned to the original wafer cassette. However, instead of returning the wafer to its original slot location, the wafer is placed in a random slot location within the cassette that is different from the slot location when the wafer originally arrived to the processing location. As part of the wafer processing recipe, slot randomization sequence instructions are added to the recipe software directing the robotic arm to slot randomize the wafers as they are being removed from the cluster tool or one of the chambers. As the wafers leave this particular processing location they have been subjected to wafer verification and have been slot randomized, effectively eliminating a wafer sorting operation proximate to the processing location and reducing wafer processing cycle time. In addition, a substantial capital investment has been avoided or delayed in not having to purchase additional wafers sorters.

Figure 1:
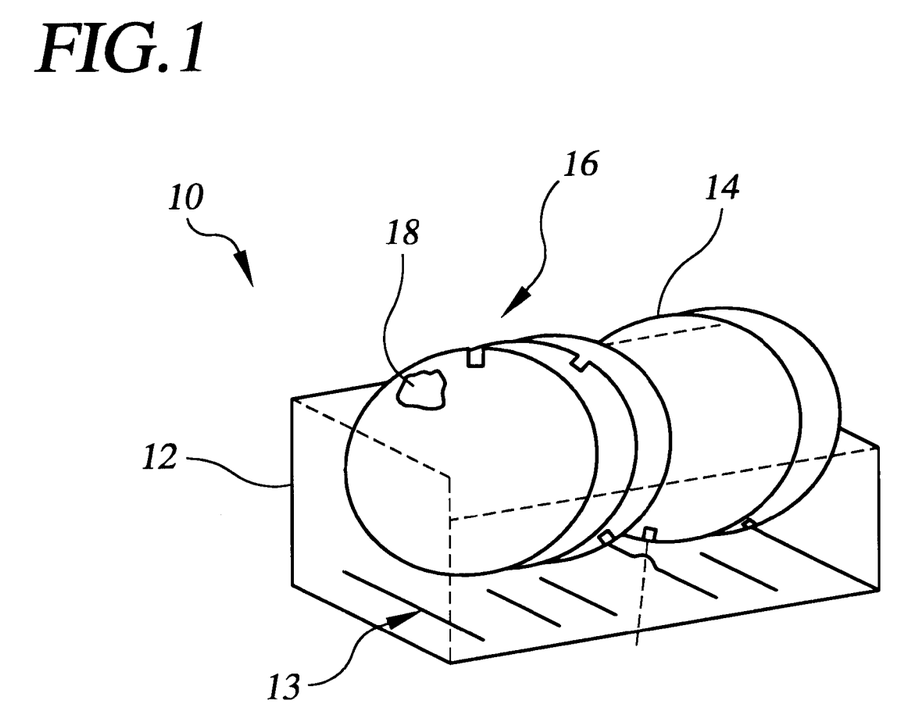
FIG. 1 is a wafer cassette having a set of unaligned wafers.

Referring now to the figures, FIG. 1 illustrates a set of wafers 10 disposed unaligned in a wafer cassette 12. Cassette 12 has a series of slots 13 that hold a set of individual wafers 14 (the set can include up to twenty-five wafers) for movement through the wafer processing system. Wafers 14 have a notch 16 located along the circumference that serves as a point of reference and is used for aligning each wafer in a processing chamber. Each wafer also has a scribe code 18 located on the wafer surface and near the wafer's edge. The scribe mark is used for wafer verification in identifying the wafer to ensure that the wafer is matched correctly with a corresponding wafer cassette. In addition, each cassette in the wafer processing system is also identified and tracked by an identification tag, such as a bar code, which is read by a sensor along the processing path or material handling system.

Figure 2:
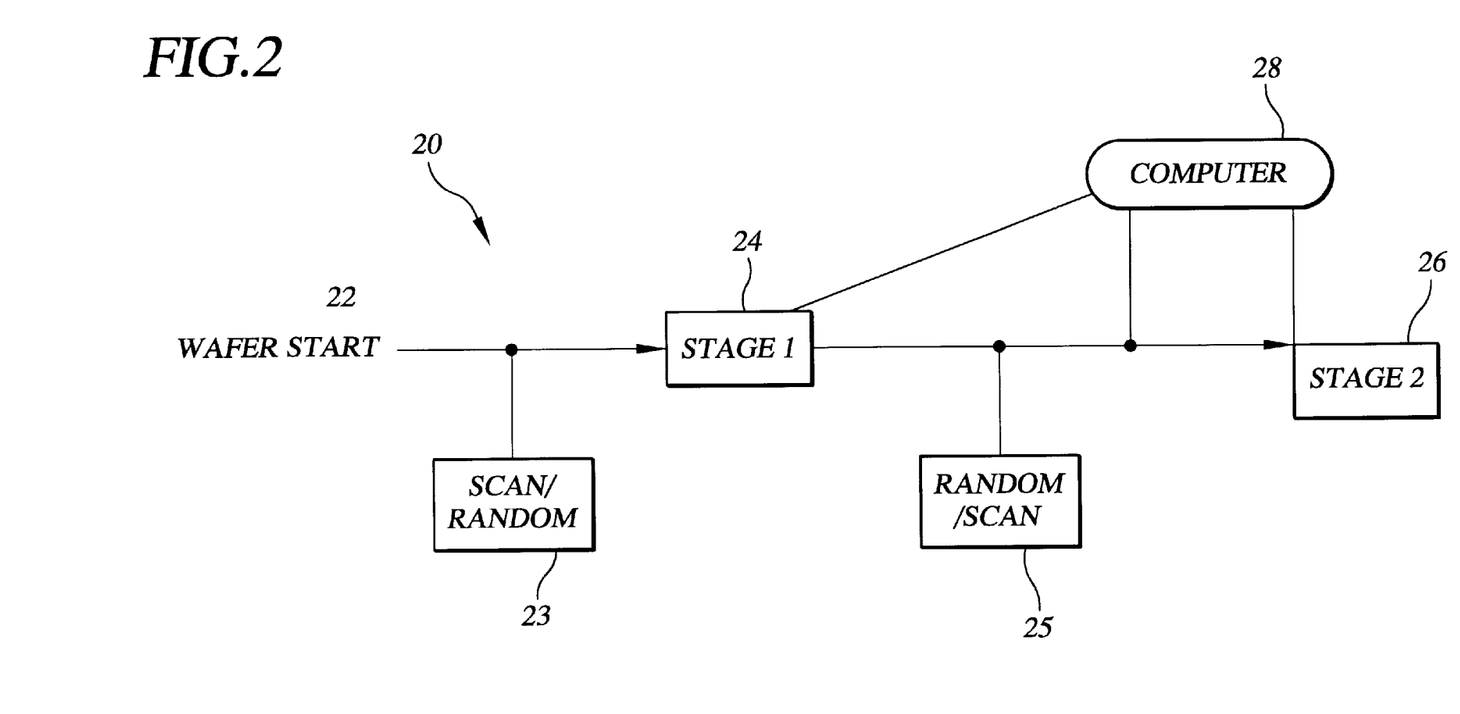
FIG. 2 is a process flow diagram of a typical wafer processing line having wafer sorting devices located between processing locations.

Referring briefly to FIG. 2, a process flow diagram exemplifies a portion of a typical wafer processing line 20. At location 22, the set of wafers starts to move through wafer processing via a material handling system. At location 23, the wafers are scanned for identification (via the scribe code) and are slot randomized by a wafer sorter 23 prior to moving to Stage one processing at location 24. This information is then recorded in a computer arrangement 28 that is coupled to wafer processing line 20. After the wafers exit location 24, they are scanned and sorted by another wafer sorter 25 prior to moving into Stage two processing at location 26. One of the disadvantages to this approach is the increase in wafer processing cycle time that occurs when there is a wafer sorter shortage and the system is forced to route the wafers to a material stocker until a sorter becomes available. One of the advantages of the present invention is ability to reduce processing cycle time by conducting wafer verification and cassette slot randomization while at a wafer processing location, thereby obviating the need for a wafer sorter.

Figure 3A:
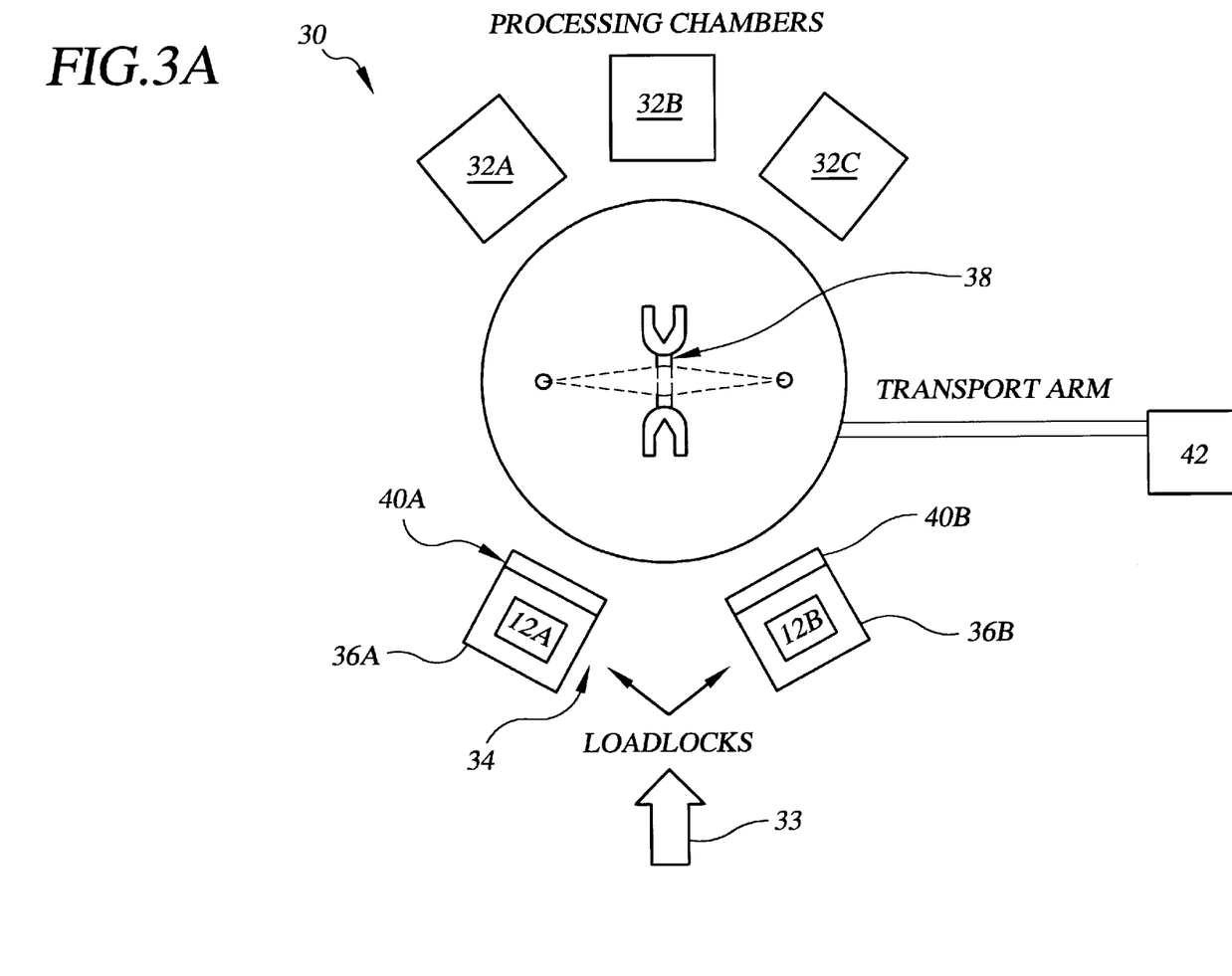
FIG. 3A is a schematic of an example processing location having a multiple chamber processing tool in accordance with one embodiment of the invention.

Referring to FIG. 3A, a schematic diagram exemplifies a portion of a wafer processing system composed of a multiple chamber processing tool 30. In this example, tool 30 has three processing chambers 32A, 32B and 32C that perform subprocesses such as metrology, etching, wafer coating, and stepper exposure and film development. Wafer cassettes 12A and 12B are presented to tool 30 via a material handling track system 33 at an entry port 34 of tool 30. Cassettes 12A and 12B are placed in a pair of loadlocks 36A and 36B, respectively. A wafer handling robotic arm 38 then aligns each set of wafers within cassettes 12A and 12B via notch 16 so that all of the wafers are aligned the same way as they move through the processing location. In this example, the wafers are removed from the cassettes individually and passed through automated scanning devices 40A and 40B, that are adapted to read scribe mark 18 located on the wafer's edge, for wafer verification. The scanning device includes an OCR (optical character reader); a laser or any other scribe or wafer marking reading device. Robotic arm 38 then moves the wafer into one of chambers 32A–32C for processing. In a related application, a rotation table is used to move the wafer from the loadlocks to a particular chamber for processing.

A wafer-processing recipe is downloaded and stored in a recipe module 42 that is adapted to direct the movement of arm 38 and the operation of processing tool 30. Included in the recipe software are the slot randomization sequence instructions for each of the wafer sets in cassettes 12A and 12B. According to the slot randomization sequence, as the wafers are removed from one of chambers 32A–32C the wafers are placed in slots that are different from the slot that the wafer originally arrive in. For instance, a wafer in slot 3 is first notch-aligned to the six o'clock position and then placed into chamber 32A. Once the processing is complete, the wafer is removed and then placed in slot 7 of the cassette or a slot other than slot 3 that is empty.

In another example embodiment, the processing tool is an etching chamber (such as an Alliance tool) that has a notch aligning arrangement coupled thereto for aligning incoming wafers before processing. The etching tool has an OCR coupled thereto that is adapted to read the scribe mark on the wafers as they are placed into the etching chamber. The processing recipe for the etching chamber that is loaded includes the slot randomization sequence for directing the robotic arm movement in its placement of the wafers into the slots of the cassette when the etching operation is complete.

Figure 3B:
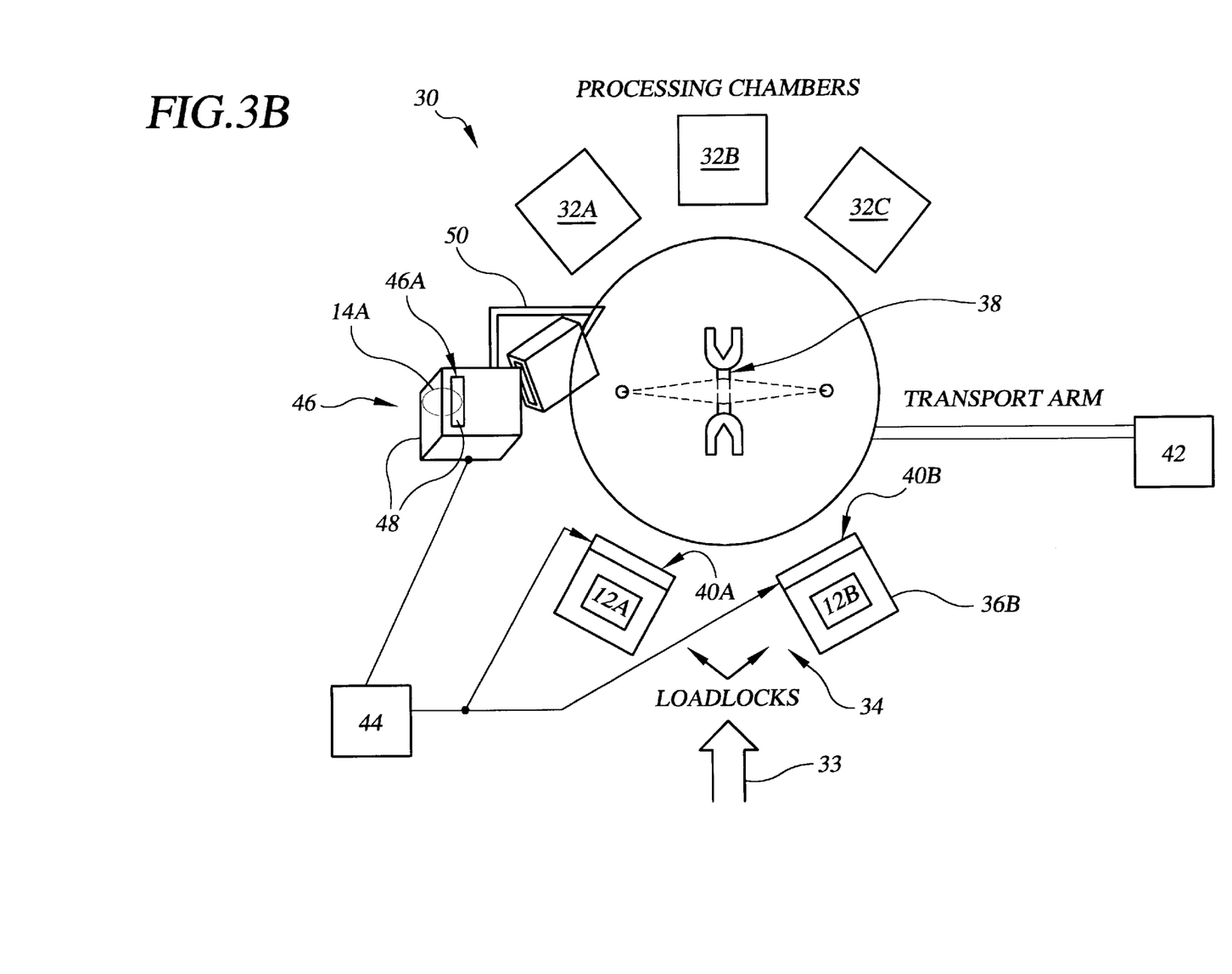
FIG. 3B is a schematic of an example of a processing location having a multiple chamber processing tool in accordance with another embodiment of the invention.

FIG. 3B illustrates a related embodiment wherein processing tool 30 is further fitted with an alarm unit 44 and a manually operated scribe reading unit 46 (e.g. Barrel Lenz unit). Materials used to treat or coat wafers, particularly photoresist, can accumulate in the area of the scribe marks and obscure the mark so as to affect the optical properties of the wafer surface. When this occurs, automated scanning devices 40A and 40B have difficulty reading the scribe marks and will signal to module 42 that the operation is to be aborted for its inability to conduct wafer verification. To avoid aborting the current operation (and slowing down the processing of the wafers), alarm unit 44 is actuated to advise an operator to use scribe reading unit 46 to manually read the scribe code and input the code via a keyboard 48. Upon alarm actuation, a robotic arm 50 removes the wafer from one of the loadlocks and places wafer 14A under a magnifying lens 46A in order to read scribe code 18. Reading unit 46 includes an angled lens 46B for reading the scribe code on smaller wafers.

Figure 4:
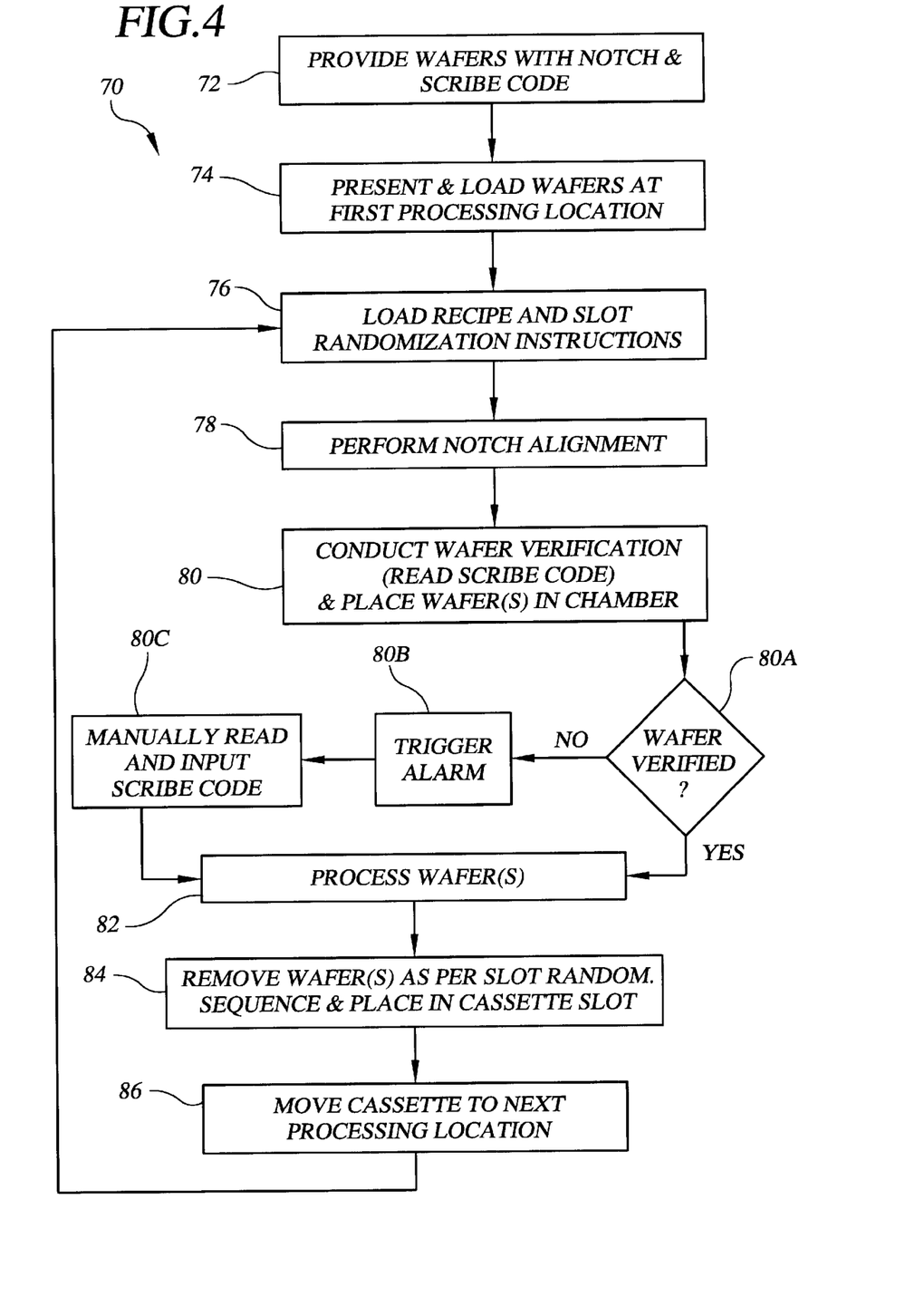
FIG. 4 is a flowchart of the manner in which wafers are verified and slot randomized in a wafer cassette while at a processing location in accordance with one embodiment of the invention.

Referring to FIG. 4, a flowchart 70 illustrates an example of the process flow of the method for processing a set of wafers in a wafer processing system having multiple-chamber processing tools in accordance with an embodiment of the present invention. At 72, a set of wafers is provided each having a scribe code and a notch thereon. At 74, the set of wafers is presented to a first processing location and loaded into the loadlock or chamber of the cluster tool. At 76, the wafer processing recipe along with the slot randomization sequence instructions are loaded onto recipe module 42. At 78, the wafers are notch-aligned to a predetermined position dictated by the processing recipe or the chamber parameters. At 80, the wafer's scribe code, cassette code and slot number (optional) are identified and recorded in a computer as part of the wafer verification procedure.

In a related embodiment, additional stages are added to the process flow where the automated scribe reading device is having difficulty reading the scribe code at location 80A. In this case, an alarm is actuated at location 80B advising an operator of a problem on the line with wafer verification. The operator then reads the scribe marks manually at location 80C and inputs the information into the processing location. Once the wafer verification is made, either automatically or manually, the wafers proceed to processing at location 82. At location 84, the wafers are removed from the processing chambers by the robotic arm according to the slot randomization sequence instructions found in the processing recipe. At location 86, the material handling system moves the wafer cassette to the next processing location where the process begins again at location 76. In a related embodiment, the wafer verification information is forwarded to the next processing location, thereby eliminating the need to conduct this procedure at the following processing location and eliminating the cost of fitting that same tool with a scribe reader.

Accordingly, the present invention is not to be necessarily limited to the particular examples described above, but is intended to cover all aspects of the invention as fairly set out in the attached claims. For instance, while wafer verification and slot randomization in a cluster tool is illustrated, other processing tools having a single operation or chamber can benefit from the above mentioned teachings. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of processing a set of wafers in a wafer processing system, the method comprising:

providing each of the wafers with a scribe code thereon;

presenting each of the wafers to a first processing location, the processing location having at least one processing chamber;

reading the scribe code on each wafer as the wafer is being placed into the at least one processing chamber; and randomizing the set of wafers as they are removed from the first processing location and placed into a wafer cassette.

2. The method of claim 1, wherein the step of providing each wafer includes providing a notch on each wafer.

3. The method of claim 2, after the step of presenting the wafers, further including the step of using the notch on each wafer to align the wafer in the one processing chamber.

4. The method of claim 1, before the step of presenting the wafers, further including the step of loading a wafer processing recipe into the first processing location, wherein the processing recipe includes a slot randomization sequence for the set of wafers.

5. The method of claim 1, wherein the step of presenting the wafer to the first processing location further includes the step of coupling an automated scribe code reading arrangement to the first processing location.

6. The method of claim 1, further including a second processing chamber at the first processing location.

7. The method of claim 5, wherein the step of presenting the wafers further includes the step of providing a manually operated scribe reading arrangement coupled to the first processing location, the manually operated scribe reading arrangement adapted to read and enter scribe code information into a memory arrangement at the first processing location.

8. The method of claim 7, wherein the step of providing the manually operated scribe reading arrangement further includes the step of providing an alarm coupled to the first processing location adapted to activate when the automated scribe reading arrangement is unable to read the scribe code on the wafer.

9. The method of claim 4, wherein the step of randomizing each of the wafers includes the step of removing each of the wafers from the first processing location and randomly placing the wafers in a cassette slot according to the randomization sequence.

10. A system for processing wafers in a wafer processing system, the system comprising:
    means for providing a set of wafers having a scribe code thereon;
    means for presenting each of the wafers to a first processing location, the first processing location having at least one processing chamber;
    means for reading the scribe code on each wafer as the wafer is being placed into the at least one processing chamber; and
    means for randomizing the set of wafers as they are removed from the first processing location and placed into a wafer cassette.

11. The system of claim 10, wherein the wafers include a notch and the system further includes means for aligning the wafers in the one processing chamber via the notch.

12. The system of claim 10, wherein the system further includes means for storing a wafer processing recipe that includes a slot randomization sequence.

13. The system of claim 12, further including:
    an alarm coupled to the first processing location adapted to activate when the means for reading the scribe code is unable to read the scribe code on the wafer; and
    a manually operated scribe code reader coupled to the first processing location adapted to read and enter scribe code information into a memory arrangement at the first processing location.

* * * * *

UNITED STATES PATENT AND TRADEMARK OFFICE
CERTIFICATE OF CORRECTION

PATENT NO.     : 6,599,763 B1
DATED          : July 29, 2003
INVENTOR(S)    : Reyes et al.

It is certified that error appears in the above-identified patent and that said Letters Patent is hereby corrected as shown below:

Column 6,
Line 6, "46B" should be removed.

Signed and Sealed this

Sixth Day of January, 2004

JAMES E. ROGAN
*Director of the United States Patent and Trademark Office*